United States Patent
Ahn et al.

(10) Patent No.: US 9,729,146 B2
(45) Date of Patent: Aug. 8, 2017

(54) GATE DRIVING CIRCUIT AND DISPLAY DEVICE HAVING THE SAME

(71) Applicant: SAMSUNG DISPLAY CO., LTD., Yongin, Gyeonggi-Do (KR)

(72) Inventors: Si-Hyun Ahn, Asan-si (KR); Seung-Soo Baek, Hwaseong-si (KR); Byoung-Sun Na, Seoul (KR); Noboru Takeuchi, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 64 days.

(21) Appl. No.: 14/581,423

(22) Filed: Dec. 23, 2014

(65) Prior Publication Data

US 2015/0228240 A1 Aug. 13, 2015

(30) Foreign Application Priority Data

Feb. 12, 2014 (KR) ........................ 10-2014-0015893

(51) Int. Cl.
  *G09G 3/36* (2006.01)
  *G11C 19/28* (2006.01)
  (Continued)

(52) U.S. Cl.
  CPC ............. *H03K 17/693* (2013.01); *G09G 3/20* (2013.01); *G09G 3/3677* (2013.01); *G11C 19/28* (2013.01);
  (Continued)

(58) Field of Classification Search
  CPC ............... G09G 3/3677; G09G 3/3674; G09G 2310/0286
  See application file for complete search history.

(56) References Cited

U.S. PATENT DOCUMENTS

2006/0290390 A1  12/2006 Jang et al.
2007/0290982 A1  12/2007 Kim et al.
(Continued)

FOREIGN PATENT DOCUMENTS

KR  1020060134530  12/2006
KR  1020070119346  12/2007
KR  1020130083151   7/2013

OTHER PUBLICATIONS

Seung-Bum Seo et al., "Drain bias effect on the instability of amorphous indium gallium zinc oxide thin film transistor"; Thin Solid Films (2013), http://dx.doi.org/10.1016/j.tsf.2012.12.109.

*Primary Examiner* — Lin Li
(74) *Attorney, Agent, or Firm* — F. Chau & Associates, LLC

(57) ABSTRACT

A gate driving circuit including first through (N)th stages is provided. An (M)th stage of the first through (N)th stages includes a pull-up control part, a pull-up part, a carry holding part, a carry part, and a first pull-down part. The pull-up control part applies a second node signal of a second node to a first node in response to the second node signal. The pull-up part outputs a clock signal as an (M)th gate output signal in response to the first node signal. The carry holding part applies the (M)th gate output signal to the second node in response to the (M)th gate output signal. The carry part outputs the clock signal as an (M)th carry signal in response to the first node signal. The first pull-down part pulls down the (M)th gate output signal to a first off voltage.

17 Claims, 12 Drawing Sheets

(51) Int. Cl.
H03K 17/693 (2006.01)
H03K 17/284 (2006.01)
H03K 17/687 (2006.01)
G09G 3/20 (2006.01)

(52) U.S. Cl.
CPC ....... *H03K 17/284* (2013.01); *H03K 17/6874* (2013.01); *G09G 2310/0267* (2013.01); *G09G 2310/0286* (2013.01)

(56) References Cited

U.S. PATENT DOCUMENTS

| | | | | |
|---|---|---|---|---|
| 2009/0040203 A1* | 2/2009 | Kim | ............... | G09G 3/3677 345/204 |
| 2009/0321731 A1 | 12/2009 | Jeong et al. | | |
| 2009/0321732 A1 | 12/2009 | Kim et al. | | |
| 2010/0158188 A1* | 6/2010 | Lee | ............... | G09G 3/3677 377/79 |
| 2010/0177082 A1* | 7/2010 | Joo | ............... | G09G 3/3677 345/211 |
| 2010/0207667 A1* | 8/2010 | Kwon | ............... | G09G 3/3674 327/108 |
| 2011/0116592 A1* | 5/2011 | Tsai | ............... | G11C 19/184 377/79 |
| 2011/0157263 A1* | 6/2011 | Kim | ............... | G09G 3/3677 345/698 |
| 2011/0193083 A1 | 8/2011 | Kim et al. | | |
| 2011/0199363 A1* | 8/2011 | Lee | ............... | G09G 3/3677 345/212 |
| 2012/0153278 A1 | 6/2012 | Jeong et al. | | |
| 2012/0169709 A1* | 7/2012 | Lee | ............... | G09G 3/3677 345/215 |
| 2012/0293467 A1* | 11/2012 | Lee | ............... | G09G 3/3677 345/204 |
| 2013/0181747 A1 | 7/2013 | Yoon et al. | | |
| 2015/0102735 A1* | 4/2015 | Kuo | ............... | G09G 3/3677 315/161 |
| 2015/0279289 A1* | 10/2015 | Yu | ............... | G11C 19/28 345/690 |

* cited by examiner

GATE DRIVING CIRCUIT AND DISPLAY DEVICE HAVING THE SAME

CROSS-REFERENCE TO RELATED APPLICATION

This application claims priority under 35 U.S.C. §119 to Korean Patent Application No. 10-2014-0015893, filed on Feb. 12, 2014 in the Korean Intellectual Property Office (KIPO), the disclosure of which is incorporated by reference herein in its entirety.

TECHNICAL FIELD

The present inventive concept relates to a display device, and more particularly, to a gate driving circuit and a display device having the gate driving circuit.

DISCUSSION OF THE RELATED ART

A display device includes a gate driving circuit providing gate signals to gate lines and a data driving circuit providing data voltages to data lines.

The gate driving circuit may include a plurality of transistors. Reliability and a lifetime of the gate driving circuit may be affected by a voltage difference between drain and source electrodes of each transistor included in the gate driving circuit. For example, as the voltage difference increases, the transistor in the gate driving circuit may deteriorate more quickly, and thus, the reliability and the lifetime of the gate driving circuit may be lessened.

SUMMARY

According to an exemplary embodiment of the present inventive concept, a gate driving circuit is provided. The gate driving circuit includes first through (N)th stages connected to each other. The first through (N)th stages is configured to output first through (N)th gate output signals, respectively, where N is an integer greater than 1. An (M)th stage of the first through (N) stages includes a pull-up control part, a pull-up part, a carry holding part, a carry part, and a first pull-down part. Here, M is an integer which is larger than or equal to 1, and less than or equal to N. The pull-up control part is configured to apply a second node signal applied to a second node to a first node and to generate a first node signal of the first node in response to the second node signal. The second node is provided with a carry signal of an (M−1)th stage or a vertical start signal. The pull-up part is configured to output a clock signal as an (M)th gate output signal in response to the first node signal. The carry holding part is configured to apply the (M)th gate output signal to the second node in response to the (M)th gate output signal. The carry part is configured to output the clock signal as an (M)th carry signal in response to the first node signal. The first pull-down part is configured to pull down the (M)th gate output signal to a first off voltage in response to a carry signal of an (M+1)th stage.

In an exemplary embodiment of the present inventive concept, the pull-up control part may include at least one transistor.

In an exemplary embodiment of the present inventive concept, the pull-up control part may include a first pull-up control transistor and a second pull-up control transistor that are connected to each other in series. The first pull-up control transistor may include a control electrode connected to the second node, an input electrode connected to the second node, and an output electrode connected to an input node of the second pull-up control transistor. The second pull-up control transistor may include a control electrode connected to the second node, an input electrode connected to the output electrode of the first pull-up control transistor, and an output node connected to the first node.

In an exemplary embodiment of the present inventive concept, the vertical start signal may be applied to the second node in the first through (K)th stages of the first through (N)th stages, where K may be an integer less than N. The carry signal of the (M−1)th stage may be applied to the second node in (K+1)th through (N)th stages of the first through (N)th stages.

In an exemplary embodiment of the present inventive concept, K may be a number of gate output signals each having a portion that overlaps the first gate output signal of the first through (N)th gate output signals.

In an exemplary embodiment of the present inventive concept, each of the first through (K)th stages may further include a starting part including a starting signal transistor. The starting signal transistor may include a control electrode to which the vertical start signal is applied, an input electrode to which the vertical start signal is applied, and an output electrode connected to the second node.

In an exemplary embodiment of the present inventive concept, the (M)th stage may further include a second pull-down part. The second pull-down part may be configured to pull down the first node signal to a second off voltage in response to the carry signal of the (M+1)th stage.

In an exemplary embodiment of the present inventive concept, the second pull-down part may include a first pull-down transistor and a second pull-down transistor that are connected to each other in series. The first pull-down transistor may include a control electrode to which the carry signal of the (M+1)th stage is applied, an input electrode to which the second off voltage is applied, and an output electrode connected to an input electrode of the second pull-down transistor. The second pull-down transistor may include a control electrode to which the carry signal of the (M+1)th stage is applied, an input electrode connected to the output electrode of the first pull-down transistor, and an output electrode connected to the first node.

In an exemplary embodiment of the present inventive concept, the (M)th stage may further include an inverting part. The inverting part may be configured to receive the clock signal and the first off voltage, and to output an inverting signal.

In an exemplary embodiment of the present inventive concept, the inverting part may include a first inverting transistor, a second inverting transistor, a third inverting transistor, and a fourth inverting transistor. The first inverting transistor may include a control electrode to which the clock signal is applied, an input electrode to which the clock signal is applied, and an output electrode connected to a seventh node. The second inverting transistor may include a control electrode connected to the seventh node, an input electrode to which the clock signal is applied, and an output electrode connected to a sixth node. The third inverting transistor may include a control electrode connected to an (M)th carry terminal, an input electrode to which the first off voltage is applied, and an output electrode connected to the seventh node. The fourth inverting transistor may include a control electrode connected to the (M)th carry terminal, an input electrode to which the first off voltage is applied, and an output electrode connected to the sixth node.

In an exemplary embodiment of the present inventive concept, the (M)th stage may further include a first holding part. The first holding part may be configured to maintain the first node signal to be the second off voltage in response to a sixth node signal applied to the sixth node.

In an exemplary embodiment of the present inventive concept, the (M)th stage may further include a second holding part. The second holding part may be configured to maintain the (M)th gate output signal to be the first off voltage in response to a sixth node signal applied to the sixth node.

In an exemplary embodiment of the present inventive concept, the (M)th stage may further include a third holding part. The third holding part may be configured to maintain the (M)th carry signal to be the second off voltage in response to a sixth node signal applied to the sixth node.

According to an exemplary embodiment of the present inventive concept, a display device is provided. The display device includes a gate driving circuit, a data driving circuit, and a timing control circuit. The gate driving circuit includes first through (N)th stages connected to each other. The first through (N)th stages is configured to output first through (N)th gate output signals, respectively, where N is an integer greater than 1. An (M)th stage of the first through (N)th stages includes a pull-up control part, a pull-up part, a carry holding part, a carry part, and a first pull-down part. Here, M is an integer which is larger than or equal to 1, and less than or equal to N. The pull-up control part is configured to apply a second node signal applied to a second node to a first node and to generate a first node signal of the first node in response to the second node signal. The second node is provided with a carry signal of an (M−1)th stage or a vertical start signal. The pull-up part is configured to output a clock signal as an (M)th gate output signal in response to the first node signal. The carry holding part is configured to apply the (M)th gate output signal to the second node in response to the (M)th gate output signal. The carry part is configured to output the clock signal as an (M)th carry signal in response to the first node signal. The first pull-down part is configured to pull down the (M)th gate output signal to a first off voltage in response to a carry signal of an (M+1)th stage.

According to an exemplary embodiment of the present inventive concept, a gate driving circuit is provided. The gate driving circuit includes first through (N)th stages connected to each other. The first through (N)th stages are configured to output first through (N)th gate output signals, respectively. Here, N is an integer greater than 1. An (M)th stage of the gate driving circuit includes a pull-up control part, a pull-up part, and a carry holding part. Here, M is an integer which is larger than or equal to 1, and less than or equal to N. The pull-up control part is configured to apply a second node signal of a second node to a first node and to generate a first node signal of the first node in response to the second node signal. The second node is provided with a carry signal of an (M−1)th stage or a vertical start signal. The pull-up part is configured to output a clock signal as an (M)th gate output signal in response to the first node signal. The carry holding part is configured to apply the (M)th gate output signal to the second node in response to the (M)th gate output signal.

BRIEF DESCRIPTION OF THE DRAWINGS

The present inventive concept and many of the attendant aspects thereof will be more clearly understood by reference to the following detailed description when considered in conjunction with the accompanying drawings in which.

DETAILED DESCRIPTION OF THE EMBODIMENTS

Exemplary embodiments of the present inventive concept will be described more fully hereinafter with reference to the accompanying drawings.

Figure 1:
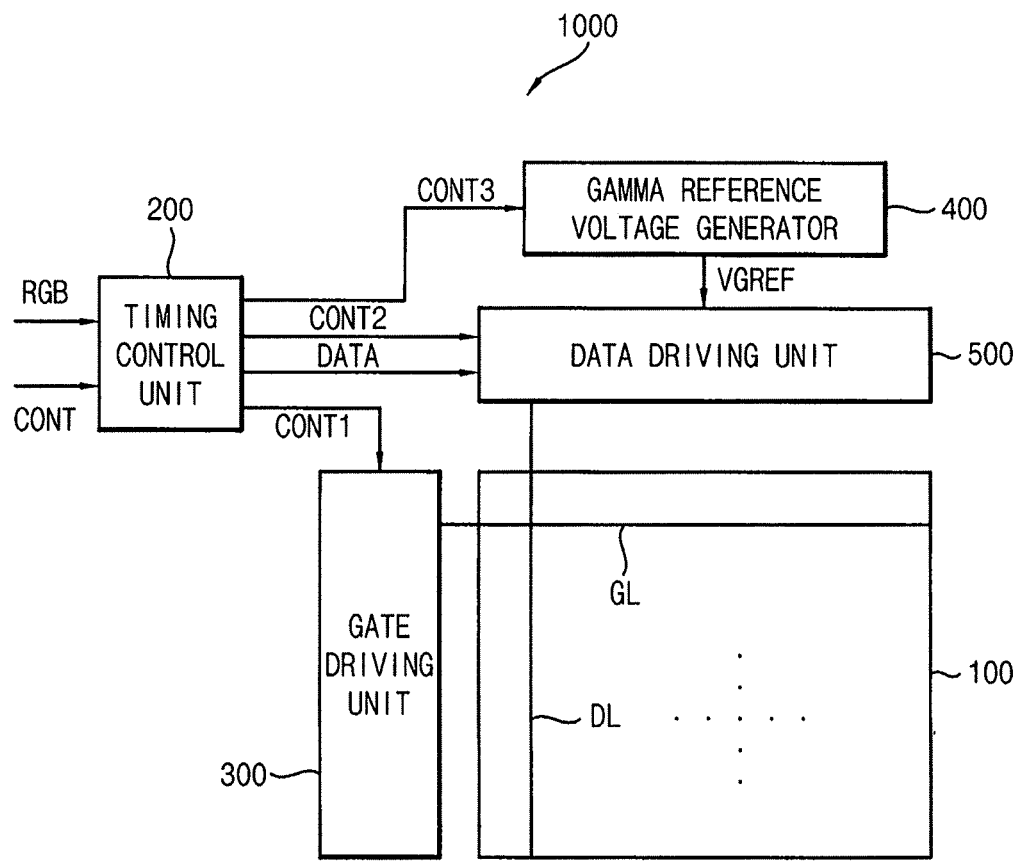
FIG. 1 is a block diagram illustrating a display device according to an exemplary embodiment of the present inventive concept.

FIG. 1 is a block diagram illustrating a display device according to an exemplary embodiment of the present inventive concept.

Referring to FIG. 1, the display device 1000 may include a display panel 100 and a panel driving unit. The panel driving unit may include a timing control unit 200, a gate driving unit 300, a gamma reference voltage generator 400, and a data driving unit 500.

The display panel 100 may have a display region that is configured to display an image and a peripheral region adjacent the display region. In an exemplary embodiment of the present inventive concept, images might not be displayed within the peripheral region.

The display panel 100 may include a plurality of gate lines GL, a plurality of data lines DL, and a plurality of unit pixels connected to the gate lines GL and the data lines DL. In an exemplary embodiment of the present inventive concept, the gate lines GL may extend in a first direction D1 and the data lines DL may extend in a second direction D2 crossing the first direction D1. In an exemplary embodiment of the present inventive concept, when the display device 1000 is a liquid crystal display, each unit pixel may include a switching element, a liquid crystal capacitor, and a storage capacitor. The liquid crystal capacitor and the storage capacitor may be electrically connected to the switching element. In an exemplary embodiment of the present inventive concept, the unit pixels may be disposed in a matrix form.

The timing control unit 200 may receive input image data RGB and an input control signal CONT. In an exemplary embodiment of the present inventive concept, the timing control unit 200 may receive the input image data RGB and input control signal CONT from an external device. In an exemplary embodiment of the present inventive concept, the input image data RGB may include red image data R, green image data G, and blue image data B. In an exemplary embodiment of the present inventive concept, the input control signal CONT may include a master clock signal and a data enable signal. In an exemplary embodiment of the present inventive concept, the input control signal CONT may include a vertical synchronizing signal and a horizontal synchronizing signal.

The timing control unit 200 may generate a first control signal CONT1, a second control signal CONT2, a third control signal CONT3, and a data signal DATA based on the input image data RGB and the input control signal CONT.

The timing control unit 200 may generate the first control signal CONT1 for controlling an operation of the gate driving unit 300 based on the input control signal CONT, and may output the first control signal CONT1 to the gate driving unit 300. In an exemplary embodiment of the present inventive concept, the first control signal CONT1 may further include a vertical start signal and a gate clock signal.

The timing control unit 200 may generate the second control signal CONT2 for controlling an operation of the data driving unit 500 based on the input control signal CONT, and may output the second control signal CONT2 to the data driving unit 500. In an exemplary embodiment of the present inventive concept, the second control signal CONT2 may include a horizontal start signal and a load signal.

The timing control unit 200 may generate the data signal DATA based on the input image data RGB. The timing control unit 200 may output the data signal DATA to the data driving unit 500.

The timing control unit 200 may generate the third control signal CONT3 for controlling an operation of the gamma reference voltage generator 400 based on the input control signal CONT, and may output the third control signal CONT3 to the gamma reference voltage generator 400.

The gate driving unit 300 may generate gate signals for driving the gate lines GL in response to the first control signal CONT1 received from the timing control unit 200. The gate driving unit 300 may sequentially output the gate signals to the gate lines GL. In an exemplary embodiment of the present inventive concept, the gate driving unit 300 may be directly mounted on the display panel 100. In an exemplary embodiment of the present inventive concept, the gate driving unit 300 may be connected to the display panel 100 as a tape carrier package (TCP) type. For example, the gate driving unit 300 may be integrated on the peripheral region of the display panel 100.

The gamma reference voltage generator 400 may generate a gamma reference voltage VGREF in response to the third control signal CONT3 received from the timing control unit 200. The gamma reference voltage generator 400 may provide the gamma reference voltage VGREF to the data driving unit 500. The gamma reference voltage VGREF may have a value corresponding to a level of the data signal DATA. In an exemplary embodiment of the present inventive concept, the gamma reference voltage generator 400 is disposed in the timing control unit 200, or in the data driving unit 500.

The data driving unit 500 may receive the second control signal CONT2 and the data signal DATA from the timing control unit 200, and may receive the gamma reference voltages VGREF from the gamma reference voltage generator 400. The data driving unit 500 may convert the data signal DATA into data voltages having an analog type using the gamma reference voltages VGREF. In an exemplary embodiment of the present inventive concept, the data driving unit 500 may sequentially output the data voltages to the data lines DL. In an exemplary embodiment of the present inventive concept, the data driving unit 500 may include a shift register, a latch, a signal processing part, and a buffer part. The shift register may output a latch pulse to the latch. The latch may temporally store the data signal DATA. The latch may output the data signal DATA to the signal processing part. The signal processing part may generate a data voltage having an analog type based on the data signal having a digital type and the gamma reference voltage VGREF. The signal processing part may output the data voltage to the buffer part. The buffer part may compensate the data voltage to have a uniform level. The buffer part may output the compensated data voltage to the data line DL. In an exemplary embodiment of the present inventive concept, the data driving unit 500 may be directly mounted on the display panel 100, or be connected to the display panel 100 in a TCP type. According to an exemplary embodiment of the present inventive concept, the data driving unit 500 may be integrated on the peripheral region of the display panel 100.

Figure 2:
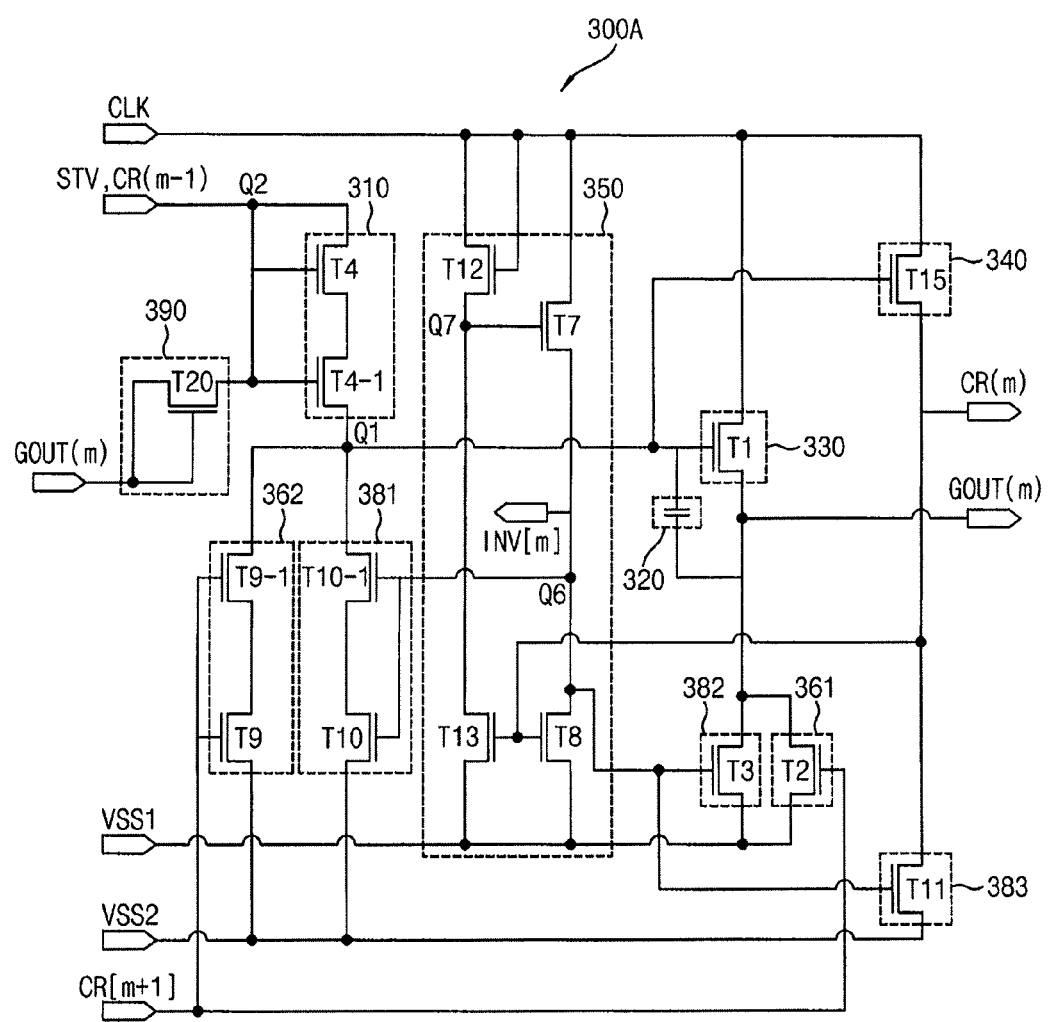
FIG. 2 is a circuit diagram illustrating an (M)th stage of a gate driving circuit included in the display device of FIG. 1 according to an exemplary embodiment of the present inventive concept.
Figure 3:
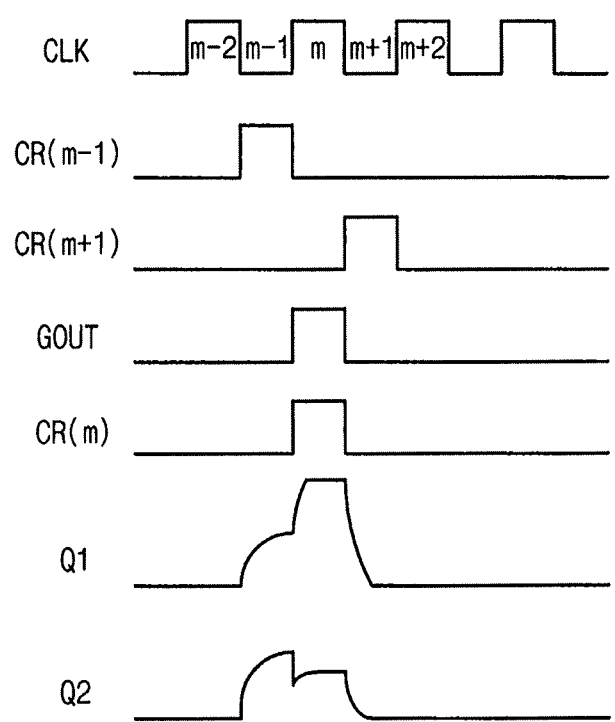
FIG. 3 is a waveform diagram illustrating input signals, node signals, and output signals in the (M)th stage of FIG. 2 according to an exemplary embodiment of the present inventive concept.

Although FIG. 1 illustrates that the display device is a liquid crystal display (LCD) device, the present inventive concept is not limited thereto. For example, the display device may be an organic light emitting display device FIG. 2 is a circuit diagram illustrating an (M)th stage of a gate driving circuit included in a display device of FIG. 1 according to an exemplary embodiment of the present inventive concept. FIG. 3 is a waveform diagram illustrating input signals, node signals, and output signals in the (M)th stage of FIG. 2 according to an exemplary embodiment of the present inventive concept.

Referring to FIGS. 2 and 3, the gate driver circuit 300A may receive a clock signal CLK, a first "off" voltage VSS1, and a second "off" voltage VSS2. The gate driver circuit 300A may output a gate output signal GOUT.

The clock signal CLK may be applied to a clock terminal. The first "off" voltage VSS1 may be applied to a first "off" terminal. The second "off" voltage VSS2 may be applied to a second "off" terminal. The gate output signal GOUT may be outputted from a gate output terminal.

The clock signal CLK may be a square wave having a high level and a low level which alternate with each other. The high level of the clock signal CLK may correspond to a first "on" voltage. For example, the first "on" voltage may be between about 15V and about 20V. The low level of the clock signal CLK may correspond to the second "off" voltage VSS2. In an exemplary embodiment of the present inventive concept, a duty ratio of the clock signal CLK may be about 50%. In an exemplary embodiment of the present inventive concept, the duty ratio of the clock signal CLK may be less than 50%. The clock signal CLK may be applied to odd-numbered stages of the gate driving unit or to even-numbered stages of the gate driving unit.

The first off voltage VSS1 may be a direct-current ("DC") signal. The second off voltage VSS2 may be a DC signal. In an exemplary embodiment of the present inventive concept, the second off voltage VSS2 may have a voltage level lower than a level of the first off voltage VSS1. For example, when the first off voltage VSS1 is about −5V, the second off voltage VSS2 may be about −10V. However, a value of the first off voltage or the second off voltage is not limited thereto.

The (M)th stage may output an (M)th gate output signal GOUT(M) and an (M)th carry signal CR(M) in response to an (M−1)th carry signal CR(M−1) of an (M−1)th stage, which is a previous stage of the (M)th stage. The (M)th stage may pull down the (M)th gate output signal GOUT(M) to the first off voltage VSS1 in response to an (M+1)th carry signal CR(M+1) of an (M+1)th stage, which is a next stage of the (M)th stage, where M is an integer between 1 and N. Thus, the first through (N)th stages of the gate driving circuit 300A may sequentially output first through (N)th output signals, respectively. For example, the first stage may output the first gate output signal GOUT(1) and the first carry signal CR(1) in response to a vertical start signal STV instead of the (M−1)th carry signal CR(M−1). In an exemplary embodiment of the present inventive concept, the gate output signals may have a portion that overlaps each other. The (M−1)th carry signal CR(M−1) may be applied to the (M−1)th carry terminal. The (M+1)th carry signal CR(M+1) may be applied to the (M+1)th carry terminal. The (M)th carry signal CR(M) may be outputted from the (M)th carry terminal.

The (M)th stage of the gate driving circuit 300A may include a pull-up control part 310, a pull-up part 330, a carry part 340, a first pull-down part 361, and a carry holding part 390.

The pull-up control part 310 may apply a second node signal applied to a second node Q2 to a first node Q1 in response to the second node signal. The second node Q2 may be provided with the (M−1)th carry signal CR(M−1). In the first stage, because the second node Q2 cannot be provided with a carry signal of a previous stage, the second node Q2 of the first stage may be provided with the vertical start signal STV. In an exemplary embodiment of the present inventive concept, the vertical start signal STV may be applied to the second node Q2 in the first through (K)th stages, where K is an integer less than N. For example, K may be the number of gate output signals each having a portion that overlaps the first gate output signal GOUT(1). For example, when a high resolution display device or a large scale display devices are driven, the clock signals of stages may have a portion that overlaps each other and thus, gate output signals each having a portion overlapping each other may be outputted. Therefore, in the first through (K)th stages, because the second node Q2 cannot be provided with a carry signal of a previous stage, the second node Q2 of the first through (K)th stages may be provided with the vertical start signal STV.

The pull-up control part 310 may include at least one transistor. In an exemplary embodiment of the present inventive concept, the pull-up control part 310 may include a pull-up control transistor. The pull-up control transistor may include a control electrode (e.g., a gate) connected to the second node Q2, an input electrode (e.g., a source) connected to the second node Q2, and an output node (e.g., a drain) connected to the first node Q1. Here, the first node Q1 may be connected to the control electrode of the pull-up part 330. In an exemplary embodiment of the present inventive concept, the pull-up control part 310 may include a plurality of transistors that are connected to each other in series. For example, the pull-up control part 310 may include a first pull-up control transistor T4 and a second pull-up control transistor T4-1 that are connected to each other in series. The first pull-up control transistor T4 may include a control electrode (e.g., a gate) connected to the second node Q2, an input electrode connected to the second node Q2, and an output electrode connected to an input node of the second pull-up control transistor T4-1. The second pull-up control transistor T4-1 may include a control electrode (e.g., a gate) connected to the second node Q2, an input electrode connected to the output electrode of the first pull-up control transistor T4, and an output node connected to the first node Q1. In the pull-up control part 310 including the first pull-up control transistor T4 and the second pull-up control transistor T4-1, a voltage between the first node Q1 and the second node Q2 is divided across the first pull-up control transistor T4 and the second pull-up control transistor T4-1. Thus, the pull-up control part 310 including the plurality of transistors (e.g., the first pull-up control transistor T4 and the second pull-up control transistor T4-1) may reduce a voltage difference between a drain electrode and a source electrode of each transistor in the gate driving circuit 300A. Therefore, the pull-up control part 310 including the first pull-up control transistor T4 and the second pull-up control transistor T4-1 may increase a lifetime of the gate driving circuit 300A.

The pull-up part 330 may output the clock signal CLK as the (M)th gate output signal GOUT(M) in response to a first node signal applied to the first node Q1. The pull-up part 330 may include a first transistor T1. The first transistor T1 may include a control electrode connected to the first node Q1, an input electrode connected to the first clock terminal and an output electrode connected to the gate output terminal.

The carry part 340 may output the clock signal CLK as the (M)th carry signal CR(M) in response to the first node signal. The carry part 340 may include a fifteenth transistor T15. The fifteenth transistor T15 may include a control electrode connected to the first node Q1, an input electrode connected to the clock terminal and an output electrode connected to the (M)th carry terminal.

The first pull-down part 361 may pull down the (M)th gate output signal GOUT(M) to the first "off" voltage VSS1 in response to the (M+1)th carry signal CR(M+1). The first pull-down part 361 may include a second transistor T2. The second transistor T2 may include a control electrode connected to the (M+1)th carry terminal, an input electrode connected to the first off terminal and an output electrode connected to the gate output terminal.

The carry holding part 390 may apply the (M)th gate output signal GOUT(M) to the second node Q2 in response to the (M)th gate output signal GOUT(M). In an exemplary embodiment of the present inventive concept, the carry holding part 390 may include a twentieth transistor T20. The twentieth transistor T20 may include a control electrode to which the (M)th gate output signal GOUT(M) is applied, an input electrode to which the (M)th gate output signal GOUT (M) is applied, and an output electrode connected to the second node Q2. Thus, the second node signal may be maintained to be high in the (M)th stage because the carry holding part 390 may reapply the (M)th gate output signal GOUT(M) to the second node Q2. Therefore, the carry holding part 390 may reduce a voltage difference between the first node Q1 and the second node Q2. In addition, the carry holding part 390 may reduce a voltage difference between a drain electrode and a source electrode of each transistor included in the pull-up control part 310. Characteristics of each transistor may deteriorate as the voltage difference between drain and source electrodes thereof increases. Therefore, the gate driving circuit 300A may prevent the characteristics of each transistor in the pull-up control part 310 from deteriorating by using the carry holding part 390.

In addition, the (M)th stage of the gate driving circuit 300A may further include a charging part 320, an inverting part 350, a second pull-down part 362, a first holding part 381, a second holding part 382, and a third holding part 383.

The charging part 320 may include a charging capacitor. The charging capacitor may include a first electrode connected to the first node Q1 and a second electrode connected to the gate output terminal.

The inverting part 350 may receive the clock signal CLK and the first "off" voltage VSS1, and may output an (M)th inverting output signal INV(m). In an exemplary embodiment of the present inventive concept, the inverting part 350 may include a first inverting transistor T12, a second inverting transistor T7, a third inverting transistor T13, and a fourth inverting transistor T8. The first inverting transistor T12 may include a control electrode to which the clock signal CLK is applied, an input electrode to which the clock signal CLK is applied, and an output electrode connected to a seventh node Q7. The second inverting transistor T7 may include a control electrode connected to the seventh node Q7, an input electrode to which the clock signal CLK is applied, and an output electrode connected to a sixth node Q6. The third inverting transistor T13 may include a control electrode connected to the (M)th carry terminal, an input electrode to which the first "off" voltage VSS1 is applied, and an output electrode connected to the seventh node Q7. The fourth inverting transistor T8 may include a control electrode connected to the (M)th carry terminal, an input electrode to which the first "off" voltage VSS1 is applied, and an output electrode connected to the sixth node Q6. The voltage of the sixth node Q6 may be an inverting output signal INV(m).

The second pull-down part 362 may pull down the first node signal at the first node Q1 to the second "off" voltage VSS2 in response to the (M+1)th carry signal CR(M+1). In an exemplary embodiment of the present inventive concept, the second pull-down part 362 may include a plurality of transistors that are connected to each other in series. For example, the second pull-down part 362 may include a first pull-down transistor T9 and a second pull-down transistor T9-1 that are connected to each other in series. The first pull-down transistor T9 may include a control electrode connected to the (M+1)th carry terminal, an input electrode connected to the second off terminal, and an output electrode connected to an input electrode of the second pull-down transistor T9-1. The second pull-down transistor T9-1 may include a control electrode connected to the (M+1)th carry terminal, an input electrode connected to the output electrode of the first pull-down transistor T9, and an output electrode connected to the first node Q1. Since the second pull-down part 362 includes two transistors connected to each other in series, a voltage between the first node Q1 and the second off terminal is divided across the first pull-down transistor T9 and the second pull-down transistor T9-1. Thus, reliability and a lifetime of the gate driving circuit 300A may be increased.

The first holding part 381 may maintain the first node signal of the first node Q1 to be the second "off" voltage VSS2 in response to a sixth node signal applied to the sixth node Q6. In an exemplary embodiment of the present inventive concept, the first holding part 381 may include a plurality of transistors that are connected to each other in series. For example, the first holding part 381 may include a first holding transistor T10 and a second holding transistor T10-1. The first holding transistor T10 may include a control electrode connected to the sixth node Q6, an input electrode connected to the second off terminal, and an output electrode connected to an input electrode of the second holding transistor T10-1. The second holding transistor T10-1 may include a control electrode connected to the sixth node Q6, an input electrode connected to the output electrode of the first holding transistor T10, and an output electrode connected to the first node Q1.

The second holding part 382 may maintain the (M)th gate output signal GOUT(M) to be the first "off" voltage VSS1 in response to the sixth node signal applied to the sixth node Q6. In an exemplary embodiment of the present inventive concept, the second holding part 382 may include a third holding transistor T3. The third holding transistor T3 may include a control electrode connected to the sixth node Q6, an input electrode connected to the first off terminal, and an output electrode connected to the gate output terminal.

The third holding part 383 may maintain the (M)th carry signal CR(M) to be the second "off" voltage VSS2 in response to the sixth node signal applied to the sixth node Q6. In an exemplary embodiment of the present inventive concept, the third holding part 383 may include a fourth holding transistor T11. The fourth holding transistor T11 may include a control electrode connected to the sixth node Q6, an input electrode connected to the second off terminal, and an output electrode connected to the (M)th carry terminal.

Although the exemplary embodiments of the present inventive concept describes that the previous carry signal is the (M−1) carry signal, the previous carry signal may be a carry signal of one of the previous stages. In addition, although the exemplary embodiments describe that the next carry signal is the (M+1) carry signal, the next carry signal may be a carry signal of one of the next stages.

In an exemplary embodiment of the present inventive concept, the transistors included in the gate driving circuit 300A may be oxide semiconductor transistors. The semiconductor layers of the transistors may include oxide semiconductor. For example, the semiconductor layer may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide, etc. The semiconductor layer 130 may include an oxide semiconductor doped with a metal such as aluminum (Al), nickel (Ni), copper (Cu), tantalum (Ta), molybdenum (Mo), hafnium (Hf), titanium (Ti), niobium (Nb), chromium (Cr), or tungsten (W). However, the present inventive concept is not limited to a material of the oxide semiconductor. In an exemplary embodiment of the present inventive concept, the transistors included in the gate driving circuit 300A may be amorphous silicon transistors.

As shown in FIG. 3, the clock signal CLK may have a high level corresponding to an (M−2)th stage, an (M)th stage, (M+2)th stage, and an (M+4)th stage (e.g., even-numbered stages). However, exemplary embodiments of the present inventive concept is not limited thereto.

The (M−1)th carry signal CR(M−1) may have a high level at a clock time corresponding to the (M−1)th stage. The (M+1)th carry signal CR(M+1) may have a high level at a clock time corresponding to the (M+1)th stage.

The (M)th gate output signal GOUT(M) of the (M)th stage may be synchronized with the clock signal CLK, and may have a high level at a clock time corresponding to the (M)th stage. The (M)th carry signal CR(M) may be synchronized with the clock signal CLK, and may have a high level at a clock time corresponding to the (M)th stage.

A voltage of the first node Q1 of the (M)th stage may be increased to a first level at the clock time corresponding to the (M−1)th stage by the pull-up control part 310. The voltage of the first node Q1 of the (M)th stage may be increased to a second level at a clock time corresponding to the (M)th stage by the pull-up part 330 and the charging part 320. The second level may be higher than the first level. The voltage of the first node Q1 of the (M)th stage may be decreased at the clock time corresponding to the (M+1)th stage by the second pull-down part 362.

A voltage of the second node Q2 of the (M)th stage may be increased to a third level at the clock time corresponding to the (M−1)th stage by the (M−1)th carry signal CR(M−1). The voltage of the second node Q2 of the (M)th stage may be maintained to be a fourth level at a clock time corresponding to the (M)th stage by the carry holding part 390. The fourth level may be similar to the third level. In addition, the voltage of the second node Q2 of the (M)th stage may be decreased at the clock time corresponding to the (M+1)th stage by the (M−1)th carry signal CR(M−1).

According to an exemplary embodiment of the present inventive concept, the voltage of the second node Q2 of the (M)th stage may be maintained to be the fourth level at the clock time corresponding to the (M)th stage by the carry holding part 390 and thus, the voltage difference between the first node Q1 and the second node Q2 may be reduced. Therefore, the gate driving circuit 300A may prevent the characteristics deterioration of transistors in the pull-up control part 310 and may increase the reliability of the pull-up control part 310.

Figure 4:
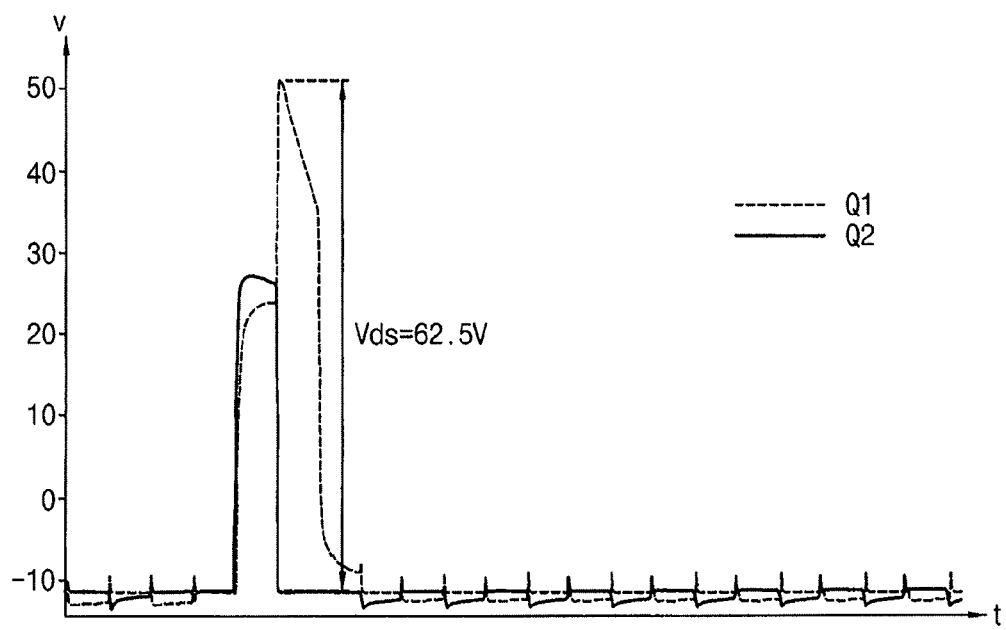
FIG. 4 is a waveform diagram illustrating a first node signal and a second node signal in a gate driving circuit that does not have a carry holding part.
Figure 5:
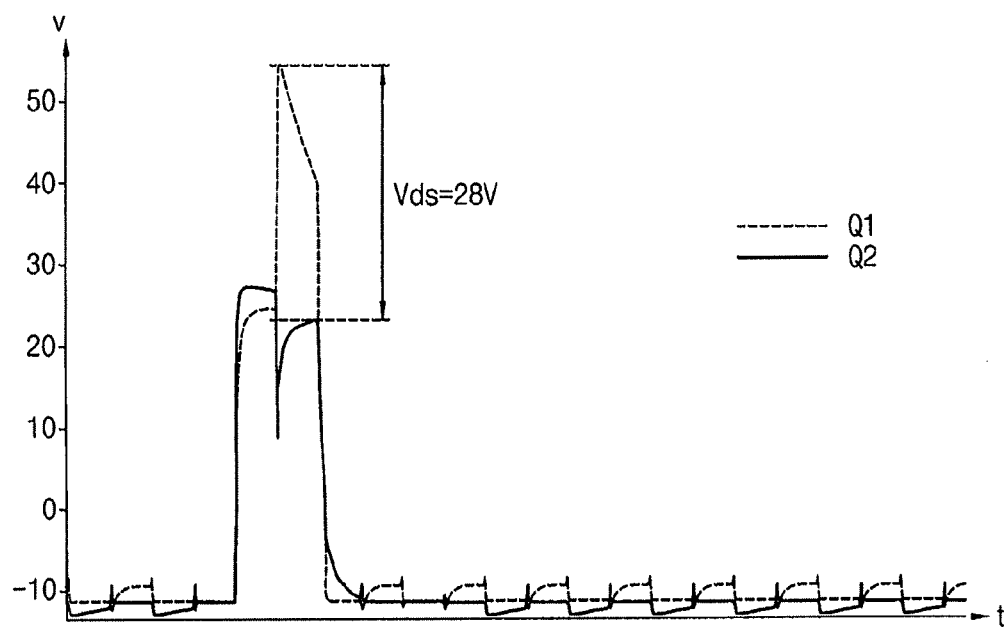
FIG. 5 is a waveform diagram illustrating a first node signal and a second node signal in a gate driving circuit included in the display device of FIG. 1 according to an exemplary embodiment of the present inventive concept.

FIG. 4 is a waveform diagram illustrating an example of a first node signal and a second node signal in a gate driving circuit that does not have a carry holding part. FIG. 5 is a waveform diagram illustrating an example of a first node signal and a second node signal in a gate driving circuit 300A included in the display device of FIG. 1 according to an exemplary embodiment of the present inventive concept.

Referring to FIGS. 4 and 5, the gate driving circuit may reduce a voltage difference between a drain electrode and a source electrode of each transistor included in a pull-up control part by using a carry holding part.

As shown in FIG. 4, when the gate driving circuit does not include the carry holding part, a voltage of the first node Q1 may be increased to a first level at a clock time corresponding to the (M−1)th stage by the pull-up control part, and may be increased to a second level at a clock time corresponding to the (M)th stage by the pull-up part and the charging part. The second level may be higher than the first level. In addition, when the gate driving circuit does not include the carry holding part, a voltage of the second node Q2 may be increased to a third level at the clock time corresponding to the (M−1)th stage by the (M−1)th carry signal, and may be decreased at the clock time corresponding to the (M)th stage by the (M−1)th carry signal CR(M−1). Therefore, when the gate driving circuit does not include the carry holding part, a voltage difference between the first node Q1 and the second node Q2 at the clock time corresponding to the (M)th stage may be relatively large (e.g., 62.5V). Thus, a voltage difference between a drain electrode and a source electrode of each transistor included in a pull-up control part may be increased and characteristics of the transistors may deteriorate. Therefore, when the gate driving circuit does not include the carry holding part, the transistors included in the pull-up control part may deteriorate.

As shown in FIG. 5, when the gate driving circuit includes the carry holding part, a voltage of the first node Q1 may be increased to the first level at the clock time corresponding to the (M−1)th stage by the pull-up control part, and may be increased to the second level at the clock time corresponding to the (M)th stage by the pull-up part and the charging part. The second level may be higher than the first level. When the gate driving circuit includes the carry holding part, a voltage of the second node Q2 may be increased to the third level at the clock time corresponding to the (M−1)th stage by the (M−1)th carry signal, and may be maintained to be a fourth level at the clock time corresponding to the (M)th stage by the carry holding part. The fourth level may be similar to the third level. Therefore, when the gate driving circuit includes the carry holding part, the voltage difference between the first node Q1 and the second node Q2 at the clock time corresponding to the (M)th stage may be relatively small (e.g., 28V), in comparison with the case when the gate driving circuit does not include the carry holding part. Thus, a voltage difference between a drain electrode and a source electrode of each transistor included in a pull-up control part may be reduced and thus, the characteristics of the transistors may not deteriorate. Therefore, when the gate driving circuit includes the carry holding part, reliability of the gate driving circuit may be increased.

Figure 6:
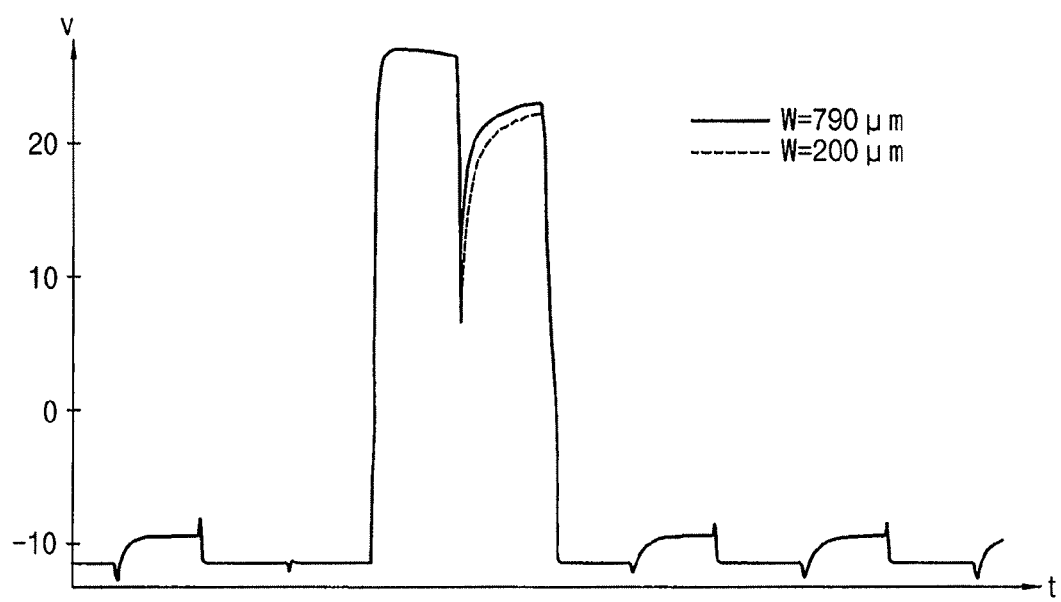
FIG. 6 is a waveform diagram illustrating a second node signal according to a width of a transistor included in a carry holding part of a gate driving circuit included in the display device of FIG. 1 according to an exemplary embodiment of the present inventive concept.

FIG. 6 is a waveform diagram illustrating a second node signal according to a width of a transistor included in a carry holding part of a gate driving circuit included in the display device of FIG. 1 according to an exemplary embodiment of the present inventive concept.

Referring to FIG. 6, a voltage of the second node Q2 may be changed according to a size of the twentieth transistor T20 included in the carry holding part 390. The voltage of the second node Q2 at the clock time corresponding to the (M)th stage may be increased in proportion to the size of the twentieth transistor T20. Therefore, the size of the twentieth transistor T20 may be adjusted to reduce a voltage difference between a drain electrode and a source electrode of each transistor included in the pull-up control part 310. When the width of twentieth transistor T20 is larger than 100 μm, the voltage of the second node Q2 at the clock time corresponding to the (M)th stage may be maintained to be high and thus, the voltage difference between a drain electrode and a source electrode of each transistor included in the pull-up control part 310 may be reduced.

Figure 7:
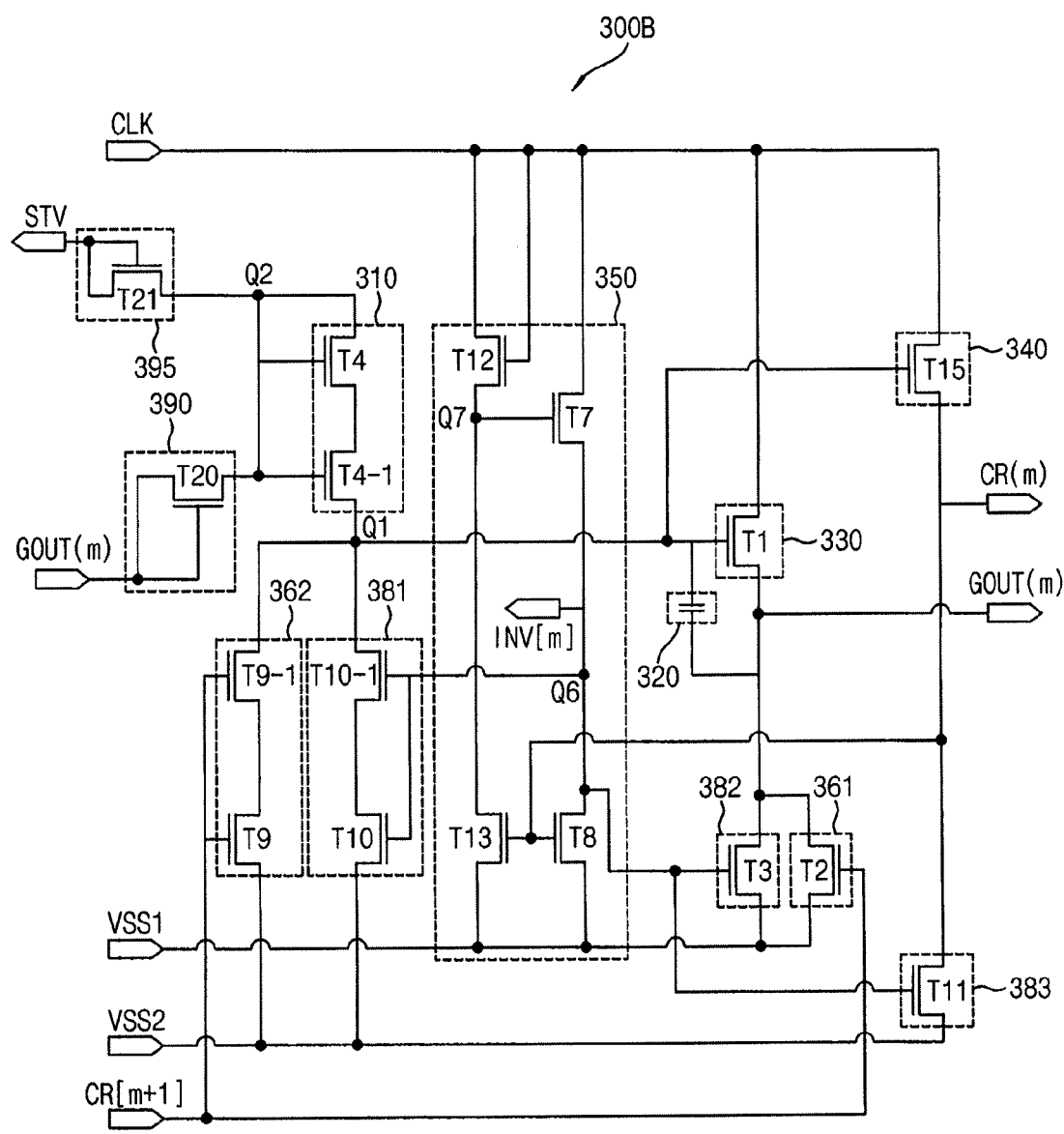
FIG. 7 is a circuit diagram illustrating a first stage of a gate driving circuit included in the display device of FIG. 1 according to an exemplary embodiment of the present inventive concept.
Figure 8:
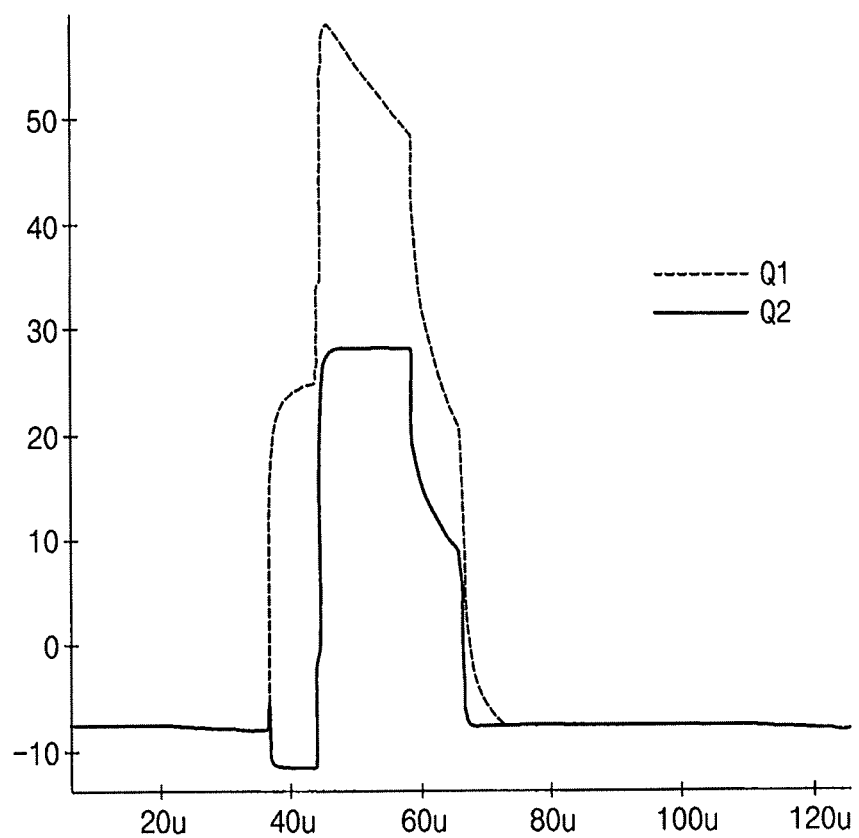
FIG. 8 is a waveform diagram illustrating a first node signal and a second node signal in a first stage of FIG. 2 according to an exemplary embodiment of the present inventive concept.
Figure 9:
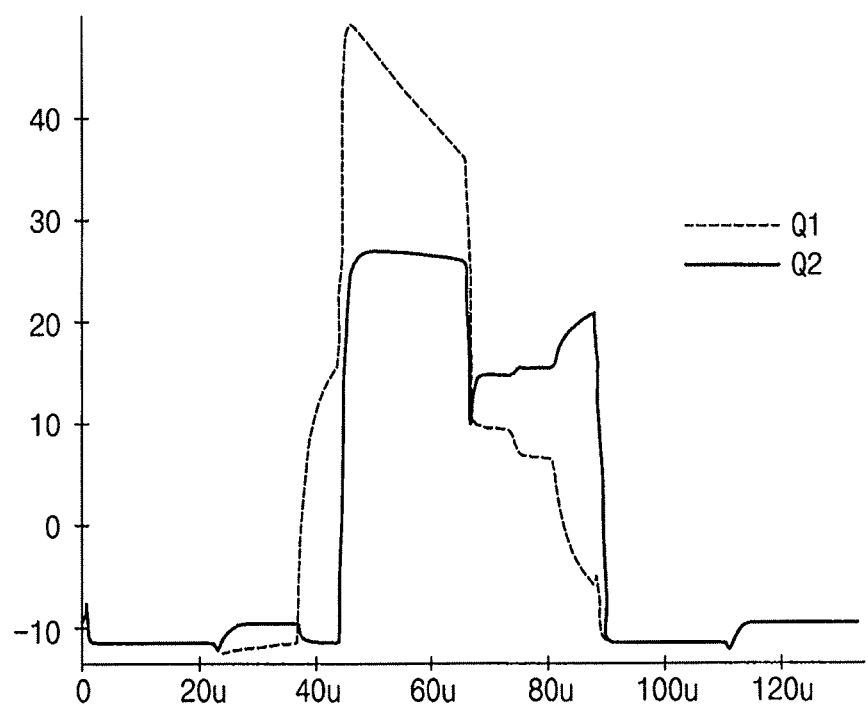
FIG. 9 is a waveform diagram illustrating a first node signal and a second node signal in a first stage of FIG. 7 according to an exemplary embodiment of the present inventive concept.

FIG. 7 is a circuit diagram illustrating a first stage of a gate driving circuit included in the display device of FIG. 1 according to an exemplary embodiment of the present inventive concept. FIG. 8 is a waveform diagram illustrating a first node signal and a second node signal in the first stage of FIG. 2 according to an exemplary embodiment of the present inventive concept. FIG. 9 is a waveform diagram illustrating a first node signal and a second node signal in the first stage of FIG. 7 according to an exemplary embodiment of the present inventive concept.

Referring to FIGS. 7 to 9, the first stage of the gate driving circuit 300B may include a starting part 395. The starting part 395 may secure a charging time of a first node Q1 and a second node Q2, and thus, the first gate output signal GOUT(1) may be outputted normally. According to an exemplary embodiment of the present inventive concept, the first stage of the gate driving circuit 300B is substantially the same as the (M)th stage of the gate driving circuit of FIG. 2, except that the starting part 395 is added between the (M−1)th carry terminal and the second node Q2. Therefore, the same reference numerals will be used to refer to the same or like elements as those of FIG. 2, and any repetitive explanation concerning the above elements will be omitted.

As shown in FIG. 7, in the first stage, because the second node Q2 cannot be provided with a carry signal of a previous stage, the second node Q2 of the first stage may be provided with a vertical start signal STV. When the vertical start signal STV has a low level, a leakage current may occur in the first node Q1 and the second node Q2 by a carry holding part because the low level of the vertical start signal STV may correspond to the second "off" voltage VSS2 unlike the carry signals. Therefore, the first gate output GOUT(1) signal may be decreased. In an exemplary embodiment of the present inventive concept, the gate driving circuit 300B may further include the starting part 395 between the (M−1) carry terminal and the second node Q2 to prevent the leakage current in the first node Q1 and the second node Q2 and to normally output the first gate output signal GOUT(1). For example, the starting part 395 may include a starting signal transistor T21. The starting signal transistor T21 may include a control electrode to which the vertical start signal STV is applied, an input electrode to which the vertical start signal STV is applied, and an output electrode connected to the second node Q2.

When a high resolution display device or a large scale display device is driven, the clock signals of stages may have a portion that overlaps each other. In an exemplary embodiment of the present inventive concept, the vertical start signal STV may be applied to the second node Q2 in the first through (K)th stages, where K is an integer less than N. For example, K may be the number of gate output signals each having a portion that overlaps the first gate output signal GOUT(1). Thus, when the clock signals CLK of the stages have a portion that overlaps each other, the vertical start signal STV may be applied to the second node Q2 because the second node Q2 cannot be provided with a carry signal of a previous stage of each of the first through (K)th stages. Therefore, in the first through (K)th stages, the gate driving circuit 300B may further include the starting part 395 between the (M−1) carry terminal and the second node Q2.

As shown in FIG. 8, when the gate driving circuit does not include the starting part 395, the leakage current may occur due to a carry holding part in the first node Q1 and the second node Q2. Therefore, the first gate output signal GOUT(1) may be decreased and a period in which the first gate output signal GOUT(1) has a high level may be shorten.

As shown in FIG. 9, when the gate driving circuit includes the starting part 395, a charging time of the first node Q1 and the second node Q2 is secured by the starting part 395, and thus, the first gate output signal GOUT(1) may be normally outputted.

Figure 10:
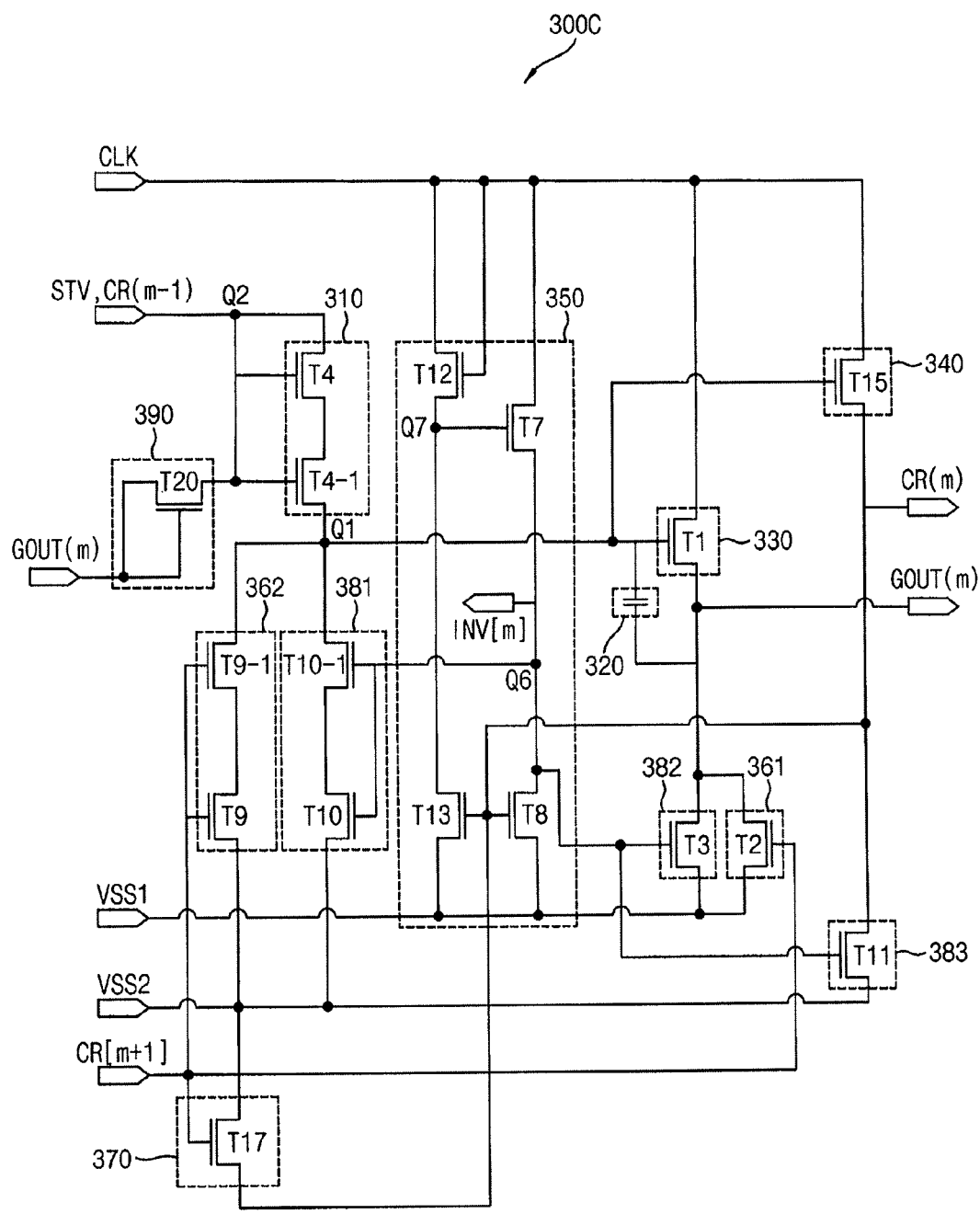
FIG. 10 is a circuit diagram illustrating an (M)th stage of a gate driving circuit included in the display device of FIG. 1 according to an exemplary embodiment of the present inventive concept.
Figure 11:
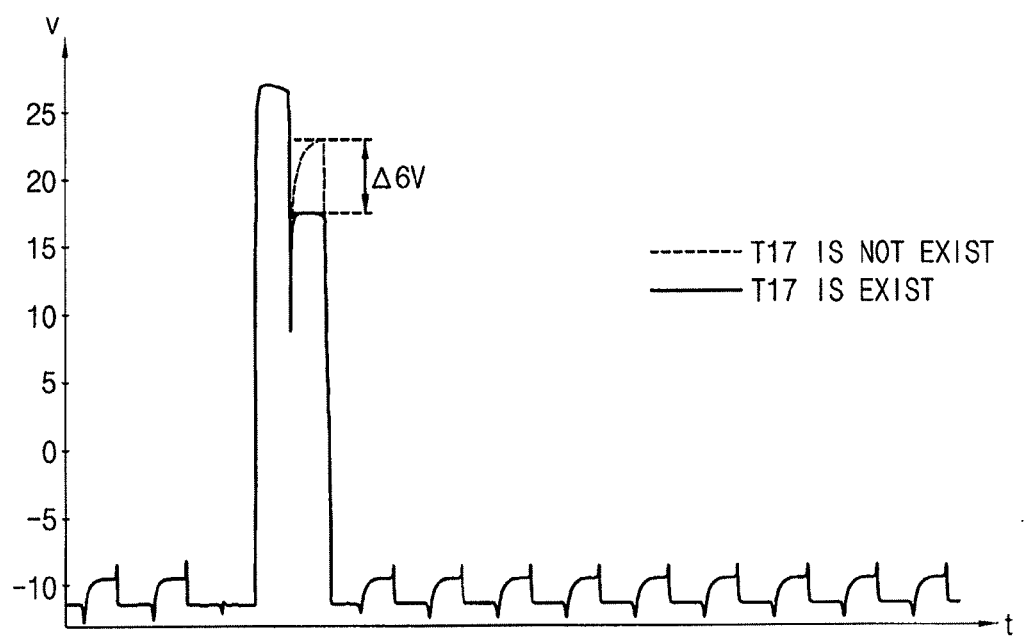
FIG. 11 is a waveform diagram illustrating a second node signal in the (M)th stage of FIG. 10 according to an exemplary embodiment of the present inventive concept.
Figure 12:
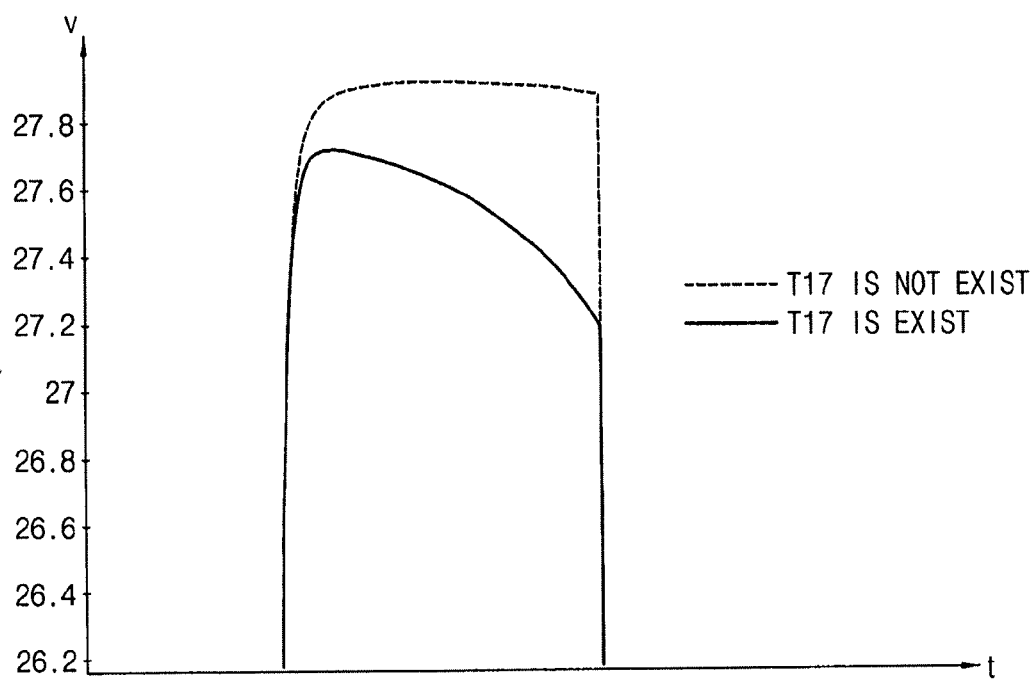
FIG. 12 is a waveform diagram illustrating an (M)th gate output signal in the (M)th stage of FIG. 10 according to an exemplary embodiment of the present inventive concept.

FIG. 10 is a circuit diagram illustrating an (M)th stage of a gate driving circuit included in a display device of FIG. 1 according to an exemplary embodiment of the present inventive concept. FIG. 11 is a waveform the diagram illustrating a second node signal in the (M)th stage of FIG. 10 according to an exemplary embodiment of the present inventive concept. FIG. 12 is a waveform diagram illustrating an (M)th gate output signal in the (M)th stage of FIG. 10 according to an exemplary embodiment of the present inventive concept.

Referring to FIGS. 10 to 12, the gate driving circuit 300C may include a carry stabilizing part 370. According to an exemplary embodiment of the present inventive concept, the (M)th stage of the gate driving circuit 300C is substantially the same as the (M)th stage of the gate driving circuit of FIG. 2, except that the carry stabilizing part 370 is added between the second off terminal and the (M)th carry terminal. Therefore, the same reference numerals will be used to refer to the same or like elements as those of FIG. 2, and any repetitive explanation concerning the above elements will be omitted.

As shown in FIG. 10, the (M)th stage of the gate driving circuit 300C may include the carry stabilizing part 370 to remove the noise created by leakage current that is transferred through the pull-up control part 310 of the (M+1)th stage. The carry stabilizing part 370 may include a seventeenth transistor T17. For example, the seventeenth transistor T17 may include a control electrode connected to the (M+1) carry terminal, an input electrode connected to the second off terminal, and an output electrode connected to the (M)th carry terminal.

As shown in FIG. 11, the gate driving circuit 300C that includes the carry stabilizing part 370 may generate the leakage current of the (M)th carry signal CR(M) through the seventeenth transistor T17 when the (M+1)th carry signal CR(M+1) has a high level. Therefore, in the gate driving circuit 300C that includes the carry stabilizing part 370, a voltage of the second node Q2 at the clock time corresponding to the (M)th stage may be lower than that of the gate driving circuit that does not include the carry stabilizing part 370 by e.g., 6V.

As shown in FIG. 12, in the gate driving circuit 300C that includes the carry stabilizing part 370, a voltage level of the (M−1)th gate output signal GOUT(M−1) may be decreased due to the leakage current of the (M)th carry signal CR(M), in comparison with gate driving circuit that does not include the carry stabilizing part 370.

Therefore, the gate driving circuit may include the carry stabilizing part 370 to remove the noise, or may not include the carry stabilizing part 370 to stably supply the gate output signal as needed.

FIGS. 13A through 13D are graphs illustrating deterioration in characteristics of transistors.

Referring to FIGS. 13A to 13D, an amount of change of current flowing into a drain electrode of a transistor is measured to observe the deterioration of the characteristics of the transistor, according to a drain voltage at the drain electrode of the transistor, a gate voltage at a control electrode of the transistor, and a voltage difference between the drain voltage and a source voltage of the transistor.

Figure 13A:
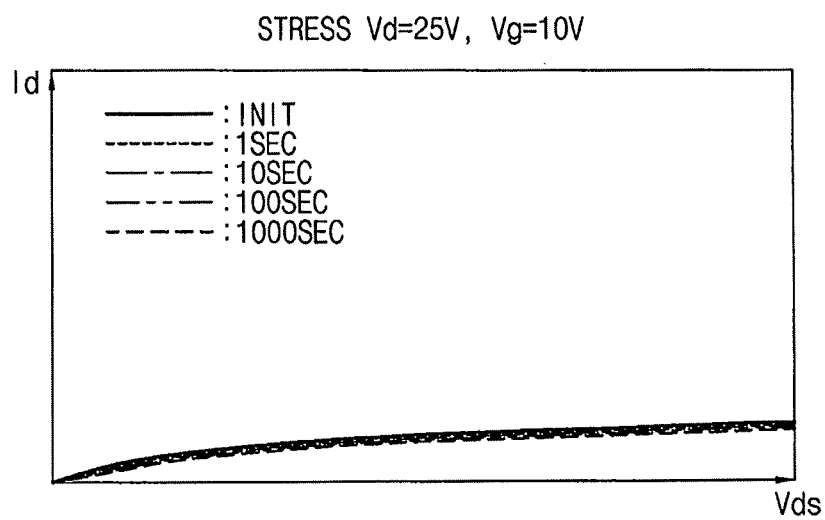
FIGS. 13A through 13D are graphs illustrating deterioration in characteristics of transistors.
Figure 13B:
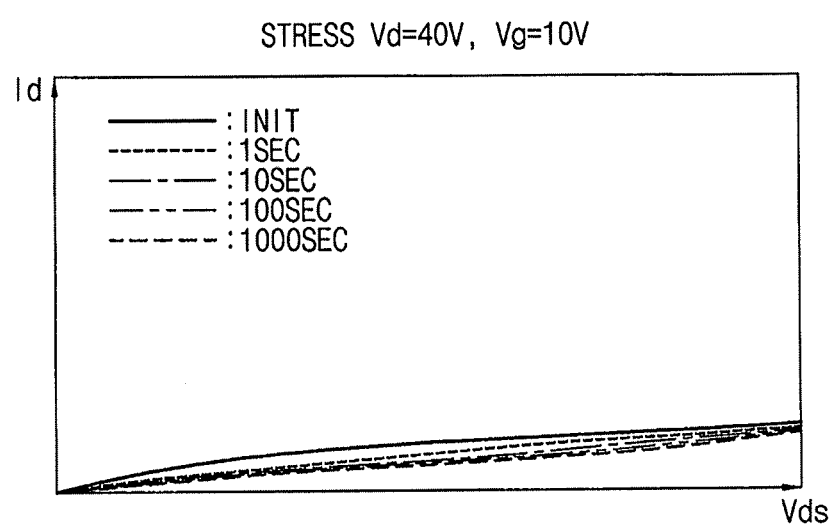
Figure 13C:
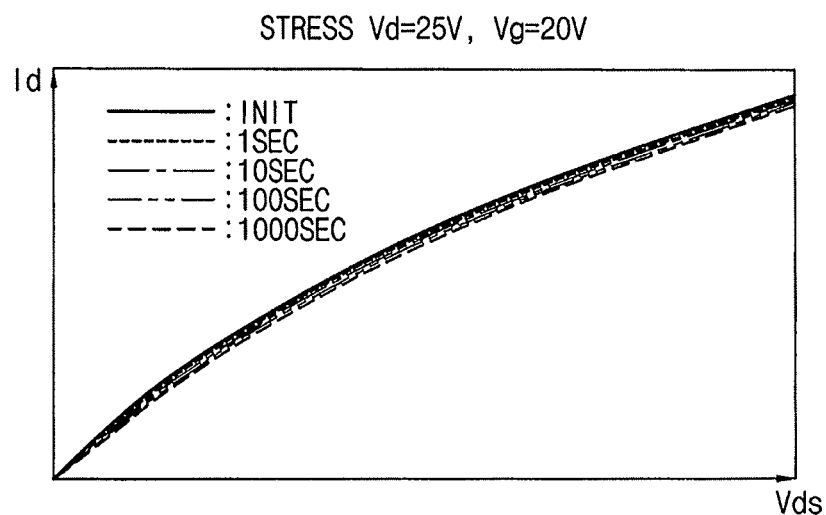
Figure 13D:
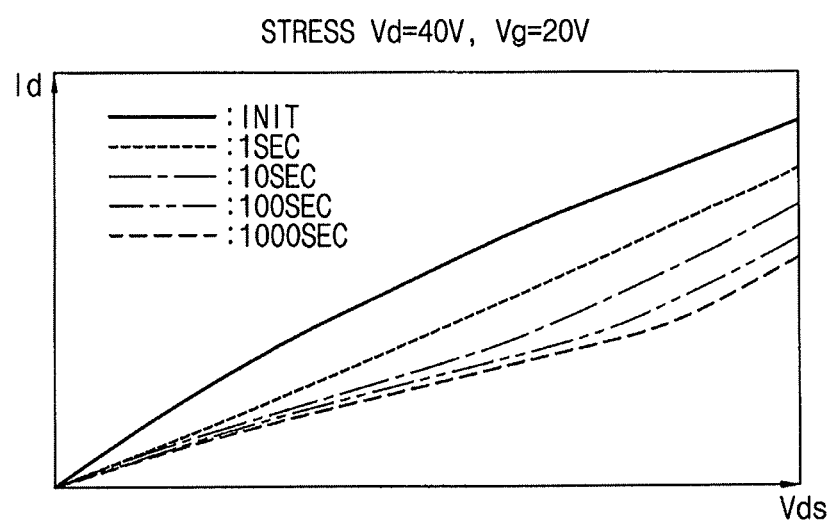

Referring to FIG. 13A, when the drain voltage Vd is 25V and the gate voltage Vg is 10V, as time passes, the amount of change of current flowing into the drain electrode Id is relatively small, for example, about 2.92%. Referring to FIG. 13B, when the drain voltage Vd is 40V and the gate voltage Vg is 10V, as time passes, the amount of change of current flowing into the drain electrode Id is relatively large, for example, about 49.26%. Referring to FIG. 13C, when the drain voltage Vd is 25V and the gate voltage Vg is 20V, as time passes, the amount of change of current flowing into the drain electrode Id is larger than that of FIG. 13A, and smaller than that of FIG. 13B. Referring to FIG. 13D, when the drain voltage Vd is 40V and the gate voltage Vg is 20V, the amount of change of current flowing into the drain electrode Id is larger than those in FIGS. 13A to 13C. Thus, when drain and gate voltages of a transistor become higher, the transistor may rapidly deteriorate. Therefore, the transistors included in the display device that is driven by a high voltage may rapidly deteriorate.

In addition, when a voltage difference between drain and source electrodes of a transistor is large, characteristics of the transistor may additionally deteriorate. For example, when the large-scale display device is driven using the gate driving circuit that does not include the carry holding part, the voltage difference between the drain and source electrodes of the transistors included in the pull-up control part is larger than 60V, and thus, a reliability of the gate driving circuit may be decreased. In addition, the gate driving circuit including the carry holding part may reduce the voltage difference between the drain and source electrodes of the transistors included in the pull-up control part. For example, when the large-scale display device is driven by using the gate driving circuit including the carry holding part, the voltage difference between the drain and source electrodes may be decreased to be less than about 30V.

Therefore, a gate driving circuit according to an exemplary embodiment of the present inventive concept may prevent the characteristics of transistors from deteriorating. The reliability and the lifetime of the display device having the gate driving circuit may be increased.

An exemplary embodiment of the present inventive concept may be applied to an electronic device having a display device. For example, an exemplary embodiment of the present inventive concept may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

Although the present inventive concept has been described with reference to exemplary embodiments thereof, it will be understood by those of ordinary skill in the art that various changes in form and detail may be made thereto without departing from the spirit and scope of the present inventive concept as defined by the claims.

What is claimed is:

1. A gate driving circuit, comprising: first through (N)th stages connected to each other, the first through (N)th stages being configured to output first through (N)th gate output signals, respectively, where N is an integer greater than 1,
wherein an (M)th stage of the first through (N)th stages, where M is an integer which is larger than or equal to 1, and less than or equal to N, comprises:
a pull-up control part configured to apply a second node signal applied to a second node to a first node and to generate a first node signal of the first node in response to the second node signal, the second node being provided with a carry signal of an (M−1)th stage or a vertical start signal;
a pull-up part configured to output a clock signal as an (M)th gate output signal in response to the first node signal;
a carry holding part configured to apply the (M)th gate output signal to the second node in response to the (M)th gate output signal;
a carry part configured to output the clock signal as an (M)th carry signal in response to the first node signal; and
a first pull-down part configured to pull down the (M)th gate output signal to a first off voltage in response to a carry signal of an (M+1)th stage,
wherein the carry holding part includes a carry holding transistor and the carry holding transistor includes a control electrode to which the (M)th gate output signal is applied, an input electrode to which the (M)th gate output signal is applied, and an output electrode connected to the second node,
wherein the pull-up control part includes a first pull-up control transistor and a second pull-up control transistor that are connected to each other in series,
wherein an output electrode of the first pull-up control transistor is exclusively connected to an input electrode of the second pull-up control transistor, and
wherein a control electrode of the first pull-up control transistor and a control electrode of the second pull-up control transistor are configured to receive the (M)th gate output signal from the carry holding part.

2. The gate driving circuit of claim 1,
wherein the control electrode and an input electrode of the first pull-up control transistor are connected to the second node, and
wherein the control electrode of the second pull-up control transistor is connected to the second node and an output electrode of the second pull-up control transistor is connected to the first node.

3. The gate driving circuit of claim 1, wherein the vertical start signal is applied to the second node in the first through (K)th stages of the first through (N)th stages, where K is an integer less than N, and
wherein the carry signal of the (M−1)th stage is applied to the second node in the (K+1)th through (N)th stages of the first through (N)th stages.

4. The gate driving circuit of claim 3, wherein K is a number of gate output signals each having a portion that overlaps the first gate output signal of the first through (N)th gate output signals.

5. The gate driving circuit of claim 3, wherein each of the first through (K)th stages further includes a starting part including a starting signal transistor, and
wherein the starting signal transistor includes a control electrode to which the vertical start signal is applied, an input electrode to which the vertical start signal is applied, and an output electrode connected to the second node.

6. The gate driving circuit of claim 1, wherein the (M)th stage further includes a second pull-down part configured to pull down the first node signal to a second off voltage in response to the carry signal of the (M+1)th stage.

7. The gate driving circuit of claim 6, wherein the second pull-down part includes a first pull-down transistor and a second pull-down transistor that are connected to each other in series,
wherein the first pull-down transistor includes a control electrode to which the carry signal of the (M+1)th stage is applied, an input electrode to which the second off voltage is applied, and an output electrode connected to an input electrode of the second pull-down transistor, and
wherein the second pull-down transistor includes a control electrode to which the carry signal of the (M+1)th stage is applied, the input electrode connected to the output electrode of the first pull-down transistor, and an output electrode connected to the first node.

8. The gate driving circuit of claim 1, wherein the (M)th stage further includes an inverting part configured to receive the clock signal and the first off voltage, and to output an inverting signal.

9. The gate driving circuit of claim 8, wherein the inverting part includes:
- a first inverting transistor including a control electrode to which the clock signal is applied, an input electrode to which the clock signal is applied, and an output electrode connected to a seventh node;
- a second inverting transistor including a control electrode connected to the seventh node, an input electrode to which the clock signal is applied, and an output electrode connected to a sixth node;
- a third inverting transistor including a control electrode connected to an (M)th carry terminal, an input electrode to which the first off voltage is applied, and an output electrode connected to the seventh node; and
- a fourth inverting transistor including a control electrode connected to the (M)th carry terminal, an input electrode to which the first off voltage is applied, and an output electrode connected to the sixth node.

10. The gate driving circuit of claim 9, wherein the (M)th stage further includes a first holding part configured to maintain the first node signal as the second off voltage in response to a sixth node signal applied to the sixth node.

11. The gate driving circuit of claim 9, wherein the (M)th stage further includes a second holding part configured to maintain the (M)th gate output signal as the first off voltage in response to a sixth node signal applied to the sixth node.

12. The gate driving circuit of claim 9, wherein the (M)th stage further includes a third holding part configured to maintain the (M)th carry signal as the second off voltage in response to a sixth node signal applied to the sixth node.

13. A display device, comprising:
- a gate driving circuit;
- a data driving circuit; and
- a timing control circuit,
- wherein the gate driving circuit includes first through (N)th stages connected to each other, the first through (N)th stages being configured to output first through (N)th gate output signals, respectively, where N is an integer larger than 1,
- wherein an (M)th stage of the first through (N)th stages, where M is an integer which is larger than or equal to 1, and less than or equal to N, comprises:
- a pull-up control part configured to apply a second node signal applied to a second node to a first node and to generate a first node signal of the first node in response to the second node signal, the second node being provided with a carry signal of an (M−1)th stage or a vertical start signal;
- a pull-up part configured to output a clock signal as an (M)th gate output signal in response to the first node signal;
- a carry holding part configured to apply the (M)th gate output signal to the second node in response to the (M)th gate output signal;
- a carry part configured to output the clock signal as an (M)th carry signal in response to the first node signal; and
- a first pull-down part configured to pull down the (M)th gate output signal to a first off voltage in response to a carry signal of an (M+1)th stage,
- wherein the pull-up control part includes a first pull-up control transistor and a second pull-up control transistor that are connected to each other in series,
- wherein the first pull-up control transistor includes a control electrode connected to the second node, an input electrode connected to the second node, and an output electrode connected to an input electrode of the second pull-up control transistor,
- wherein the second pull-up control transistor includes a control electrode connected to the second node, an input electrode connected to the output electrode of the first pull-up control transistor, and an output electrode connected to the first node,
- wherein the output electrode of the first pull-up control transistor is exclusively connected to the input electrode of the second pull-up control transistor, and
- wherein the control electrode of the first pull-up control transistor and the control electrode of the second pull-up control transistor are configured to receive the (M)th gate output signal from the carry holding part.

14. The display device of claim 13, wherein the vertical start signal is applied to the second node in the first through (K)th stages of the first through (N)th stages, where K is an integer less than N, and
- wherein the carry signal of the (M−1)th stage is applied to the second node in the (K+1)th through (N)th stages of the first through (N)th stages.

15. The display device of claim 14, wherein K is a number of gate output signals each having a portion that overlaps the first gate output signal of the first through (N)th gate output signals.

16. The display device of claim 14, wherein each of the first through (K)th stages further includes a starting part including a starting signal transistor, and
- wherein the starting signal transistor includes a control electrode to which the vertical start signal is applied, an input electrode to which the vertical start signal is applied, and an output electrode connected to the second node.

17. A gate driving circuit, comprising: first through (N)th stages connected to each other, the first through (N)th stages being configured to output first through (N)th gate output signals, respectively, where N is an integer greater than 1,
- wherein an (M)th stage of the first through (N)th stages, where M is an integer which is larger than or equal to 1, and less than or equal to N, comprises:
- a pull-up control part configured to apply a second node signal of a second node to a first node and to generate a first node signal of the first node in response to the second node signal, the second node being provided with a carry signal of an (M−1)th stage or a vertical start signal;
- a pull-up part configured to output a clock signal as an (M)th gate output signal in response to the first node signal;
- a carry holding part configured to apply the (M)th gate output signal to the second node in response to the (M)th gate output signal,
- wherein the pull-up control part includes a first pull-up control transistor and a second pull-up control transistor that are connected to each other in series,
- wherein an output electrode of the first pull-up control transistor is exclusively connected to an input electrode of the second pull-up control transistor, and
- wherein a control electrode of the first pull-up control transistor and a control electrode of the second pull-up control transistor are configured to receive the (M)th gate output signal from the carry holding part.

* * * * *